(12) United States Patent
Yamada et al.

(10) Patent No.: US 10,044,332 B2
(45) Date of Patent: Aug. 7, 2018

(54) TRANSMISSION APPARATUS, RECEPTION APPARATUS, AND TRANSMISSION/RECEPTION SYSTEM (71) Applicant: THINE ELECTRONICS, INC., Tokyo (JP)

(72) Inventors: Kotaro Yamada, Tokyo (JP); Hiroki Honda, Tokyo (JP); Kenta Noguchi, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 0 days.

(21) Appl. No.: 15/039,647

(22) PCT Filed: Oct. 20, 2014

(86) PCT No.: PCT/JP2014/077841
§ 371 (c)(1),
(2) Date: May 26, 2016

(87) PCT Pub. No.: WO2015/079827
PCT Pub. Date: Jun. 4, 2015

(65) Prior Publication Data
US 2017/0026012 A1 Jan. 26, 2017

(30) Foreign Application Priority Data
Nov. 28, 2013 (JP) .................................. 2013-246121

(51) Int. Cl.
*H03K 17/16* (2006.01)
*H03F 3/45* (2006.01)
*H04L 25/02* (2006.01)

(52) U.S. Cl.
CPC ..... *H03F 3/45179* (2013.01); *H03F 3/45632* (2013.01); *H04L 25/0272* (2013.01)

(58) Field of Classification Search
CPC .............. H03K 17/16; H03K 19/0005; H03K 19/017509; H03K 19/017545; H04L 25/028; H04L 25/0278; H04L 25/0298
(Continued)

(56) References Cited
U.S. PATENT DOCUMENTS 6,654,462 B1 * 11/2003 Hedberg ............. H03F 3/45959
379/399.01
7,979,754 B2 * 7/2011 Drost ............... G01R 31/31922
29/834
(Continued)

FOREIGN PATENT DOCUMENTS

JP 6094593 A 5/1985
JP 2000-68813 A 3/2000
(Continued)

OTHER PUBLICATIONS

International Search Report dated Jan. 20, 2015 in counterpart International Application No. PCT/JP2014/077841.
(Continued)

*Primary Examiner* — Don Le
(74) *Attorney, Agent, or Firm* — Sughrue Mion, PLLC (57) ABSTRACT

A transmission/reception system 1 includes a transmission apparatus 10A, and a reception apparatus 20A. The transmission apparatus 10A includes a first switch 101, a second switch 102, a first transistor 111, a second transistor 112, a first differential amplifier 121, and a second differential amplifier 122. The reception apparatus 20A includes a first transistor 211, a second transistor 212, a first differential amplifier 221, a second differential amplifier 222, a first resistor 231, a second resistor 232, and a reception unit 240.

16 Claims, 5 Drawing Sheets

(58) Field of Classification Search
USPC .................................................. 326/21, 30
See application file for complete search history.

(56) References Cited

U.S. PATENT DOCUMENTS

| | | |
|---|---|---|
| 2001/0052796 A1 | 12/2001 | Tomita |
| 2002/0135404 A1* | 9/2002 | Payne .............. H03K 19/01721 327/108 |
| 2003/0193350 A1* | 10/2003 | Chow ............ H03K 19/018585 326/83 |
| 2005/0088218 A1* | 4/2005 | Shibata .................. H04L 25/45 327/333 |
| 2009/0140778 A1* | 6/2009 | Kikuchi .............. H03F 3/45197 327/108 |
| 2011/0141829 A1* | 6/2011 | Ware ........................ G11C 5/14 365/189.09 |
| 2011/0169547 A1* | 7/2011 | Suzuki ............ H03K 19/00361 327/384 |
| 2012/0013361 A1* | 1/2012 | Ware .............. H03K 19/017509 326/30 |

FOREIGN PATENT DOCUMENTS

| | | |
|---|---|---|
| JP | 2002-509682 A | 3/2002 |
| JP | 2009-290843 A | 12/2009 |
| WO | 99/57810 A2 | 11/1999 |

OTHER PUBLICATIONS

International Preliminary Report on Patentability dated Jun. 9, 2016 from the International Bureau in counterpart International Application No. PCT/JP2014/077841.

Communication dated Jun. 12, 2018 from the Japanese Patent Office in counterpart Japanese application No. 2013-246121.

Communication dated May 28, 2018 from the Taiwanese Patent Office in counterpart Taiwanese application No. 103138038.

* cited by examiner

|  | FIRST SWITCH 101 | SECOND SWITCH 102 | FIRST SIGNAL LINE 31 | SECOND SIGNAL LINE 32 | PROPAGATION SIGNAL |
|---|---|---|---|---|---|
| CASE A | ON | ON | L | H | L |
| CASE B | OFF | OFF | H | L | H |

|  |  | FIRST SWITCH 101 | SECOND SWITCH 102 | OUTPUT | FIRST SIGNAL LINE 31 | SECOND SIGNAL LINE 32 | PROPAGATION SIGNAL |
|---|---|---|---|---|---|---|---|
| CASE C | TRANSMISSION APPARATUS 10A | OFF | OFF | H (HiZ) | L | H | L |
|  | TRANSMISSION APPARATUS 10B | ON | ON | L |  |  |  |
| CASE D | TRANSMISSION APPARATUS 10A | OFF | OFF | H (HiZ) | H | L | H |
|  | TRANSMISSION APPARATUS 10B | OFF | OFF | H (HiZ) |  |  |  |
| CASE E | TRANSMISSION APPARATUS 10A | ON | ON | L | L | H | L |
|  | TRANSMISSION APPARATUS 10B | OFF | OFF | H (HiZ) |  |  |  |
| CASE F | TRANSMISSION APPARATUS 10A | ON | ON | L | L | H | L |
|  | TRANSMISSION APPARATUS 10B | ON | ON | L |  |  |  |

Fig.5

TRANSMISSION APPARATUS, RECEPTION APPARATUS, AND TRANSMISSION/RECEPTION SYSTEM

CROSS REFERENCE TO RELATED APPLICATIONS

This application is a National Stage of International Application No. PCT/JP2014/077841 filed Oct. 20, 2014, claiming priority based on Japanese Patent Application No. 2013-246121 filed Nov. 28, 2013, the contents of all of which are incorporated herein by reference in their entirety.

TECHNICAL FIELD

The present invention relates to a transmission apparatus, a reception apparatus, and a transmission/reception system.

BACKGROUND ART

A transmission/reception system transmitting differential signals from a transmission apparatus to a reception apparatus is tolerant of common-mode noise in principal, compared to a case of transmitting single-ended signals. There are various known methods for transmitting the differential signals, one of which is a low-voltage differential signaling (LVDS) method. Furthermore, there is a demand on implementation of a multi-drop or multi-point method with regard to the transmission/reception system. In the multi-drop method, signals are transmitted from one transmission apparatus to a plurality of reception apparatuses. In the multi-point method, signals are transmitted and received reciprocally between a plurality of transmission apparatuses and reception apparatuses.

However, there are few cases that the signal transmission has been put into practice by the multi-drop or multi-point method with respect to the transmission/reception system which transmits the differential signals. The reason is that in a case where the plurality of transmission apparatuses unintendedly transmits different logical signals, amplitude of the signals received by the reception apparatuses may change, which causes a receive error. Otherwise, in such a case, a large electric current may flow in the transmission apparatuses or the reception apparatuses, which causes a fault in the apparatuses.

CITATION LIST

Patent Literature

[PTL 1] Japanese Unexamined Patent Publication No. 2009-290843

SUMMARY OF INVENTION

Technical Problem

PTL 1 discloses an invention which intends to solve the aforementioned problems. The invention disclosed in the literature intends to prevent an occurrence of the aforementioned problems by mutually separating direct currents between the transmission/reception apparatuses and signal lines with using a capacitor or an inductor.

An object of the present invention is to provide a transmission apparatus, a reception apparatus, and a transmission/reception system where an occurrence of a receive error or a fault can be reduced with a simple configuration and without involving a capacitor or an inductor even, in a case of transmitting differential signals by a multi-drop or multi-point method.

Solution to Problem

A transmission apparatus according to the present invention is an apparatus transmitting differential signals, corresponding to an input signal, from a first transmission end and a second transmission end, the transmission apparatus, including: (1) a first transistor including a first terminal, a second terminal, and a control terminal, wherein a first power source potential is applied to the first terminal, and a resistance value between the first terminal and the second terminal is set corresponding to a voltage value which is to be input to the control terminal; (2) a first switch provided between the second terminal of the first transistor and the second transmission end and set to be in either an open or close state corresponding to a level of the input signal; (3) a first differential amplifier including a first input terminal, a second input terminal, and an output terminal, wherein the first input terminal is connected to the second terminal of the first transistor or the second transmission end, a first reference potential is applied to the second input terminal, and the output terminal is connected to the control terminal of the first transistor; (4) a second transistor including a first terminal, a second terminal, and a control terminal, wherein a second power source potential lower than the first power source potential is applied to the first terminal, and a resistance value between the first terminal and the second terminal is set corresponding to a voltage value which is to be input to the control terminal; (5) a second switch provided between the second terminal of the second transistor and the first transmission end and set to be in either the open or close state corresponding to the level of the input signal; and (6) a second differential amplifier including a first input terminal, a second input terminal, and an output terminal, wherein the first input terminal is connected to the second terminal of the second transistor or the first transmission end, a second reference potential lower than the first reference potential is applied to the second input terminal, and the output terminal is connected to the control terminal of the second. transistor. Herein, the first and second transistors may be provided separately from the first and second differential amplifiers, respectively. Otherwise, each of the first and second transistors may include a driving unit which is to be provided in an output stage within each differential amplifier.

The transmission apparatus according to the present invention may further include: (7) a third switch provided between the second terminal of the first transistor and the first transmission end and set to be in either the open or close state corresponding to the level of the input signal; (8) a fourth switch provided between the second terminal of the second transistor and the second transmission end and set to be in either the open or close state corresponding to the level of the input signal; (8) a fifth switch selectively connecting the first input terminal of the first differential amplifier to either the second terminal of the first transistor or the second transmission end; and (10) a sixth switch selectively connecting the first input terminal of the second differential amplifier to either the second terminal of the second transistor or the first transmission end.

The reception apparatus according to the present invention is an apparatus receiving differential signals which are input to a first reception end and a second reception end, the reception apparatus including: (1) a first resistor provided between the first reception end and a first reference potential end to which a first reference potential is applied; (2) a second resistor provided between the second reception end and a second reference potential end to which a second reference potential lower than the first reference potential is applied; and (3) a reception unit receiving the differential signals by inputting each voltage value of the first reception end and the second reception end.

The reception apparatus according to the present invention may further include: (4) a first transistor including a first terminal, a second terminal, and a control terminal, wherein the first power source potential is applied to the first terminal, the second terminal is connected to the first reference potential end, and a resistance value between the first terminal and the second terminal is set corresponding to a voltage value which is to be input to the control terminal; (5) a first differential amplifier including a first input terminal, a second input terminal, and an output terminal, wherein the first input terminal is connected to the second terminal of the first transistor, the first reference potential is applied to the second input terminal, and the output terminal is connected to the control terminal of the first transistor; (6) a second transistor including a first terminal, a second terminal, and a control terminal, wherein the second power source potential lower than the first power source potential is applied, to the first terminal, the second terminal is connected to the second reference potential end, and the resistance value between the first terminal and the second terminal is set corresponding to the voltage value which is to be input to the control, terminal; and (7) a second differential amplifier including a first input terminal, a second input terminal, and an output terminal, wherein the first input terminal is connected to the second terminal of the second transistor, the second reference potential is applied to the second input terminal, and the output terminal is connected to the control terminal of the second transistor.

The reception apparatus according to the present invention may further include: (8) a first switch provided between the first reference potential end and the first resistor or between the first resistor and the first reception end; and (9) a second switch provided between the second reference potential end and the second resistor or between the second resistor and the second reception end.

The transmission/reception system according to the present invention includes: the transmission apparatus of the present invention; the reception apparatus of the present invention; a first signal line connecting the first transmission end of the transmission apparatus and the first reception end of the reception apparatus; and a second signal line connecting the second transmission end of the transmission apparatus and the second reception end of the reception apparatus. Otherwise, the transmission/reception system according to the present invention includes: a plurality of aforementioned transmission apparatuses of the present invention; the aforementioned reception apparatus of the present invention; a first signal line connecting the first transmission end of each of the plurality of transmission apparatuses and the first reception end of the reception apparatus; and a second signal line connecting the second transmission end of each of the plurality of transmission apparatuses and the second reception end of the reception apparatus.

Advantageous Effects of Invention

According to the present invention, an occurrence of a receive error or fault can be reduced with a simple configuration without involving a capacitor or an inductor even in a case of transmitting differential signals by a multi-drop method or multi-point method.

DESCRIPTION OF EMBODIMENTS

Hereinafter, embodiments of the present invention will be described in detail with reference to the accompanying drawings. It should be noted that elements identical in descriptions of the drawings will be denoted by the same reference numerals, and redundant descriptions thereof will be omitted.

Figure 1:
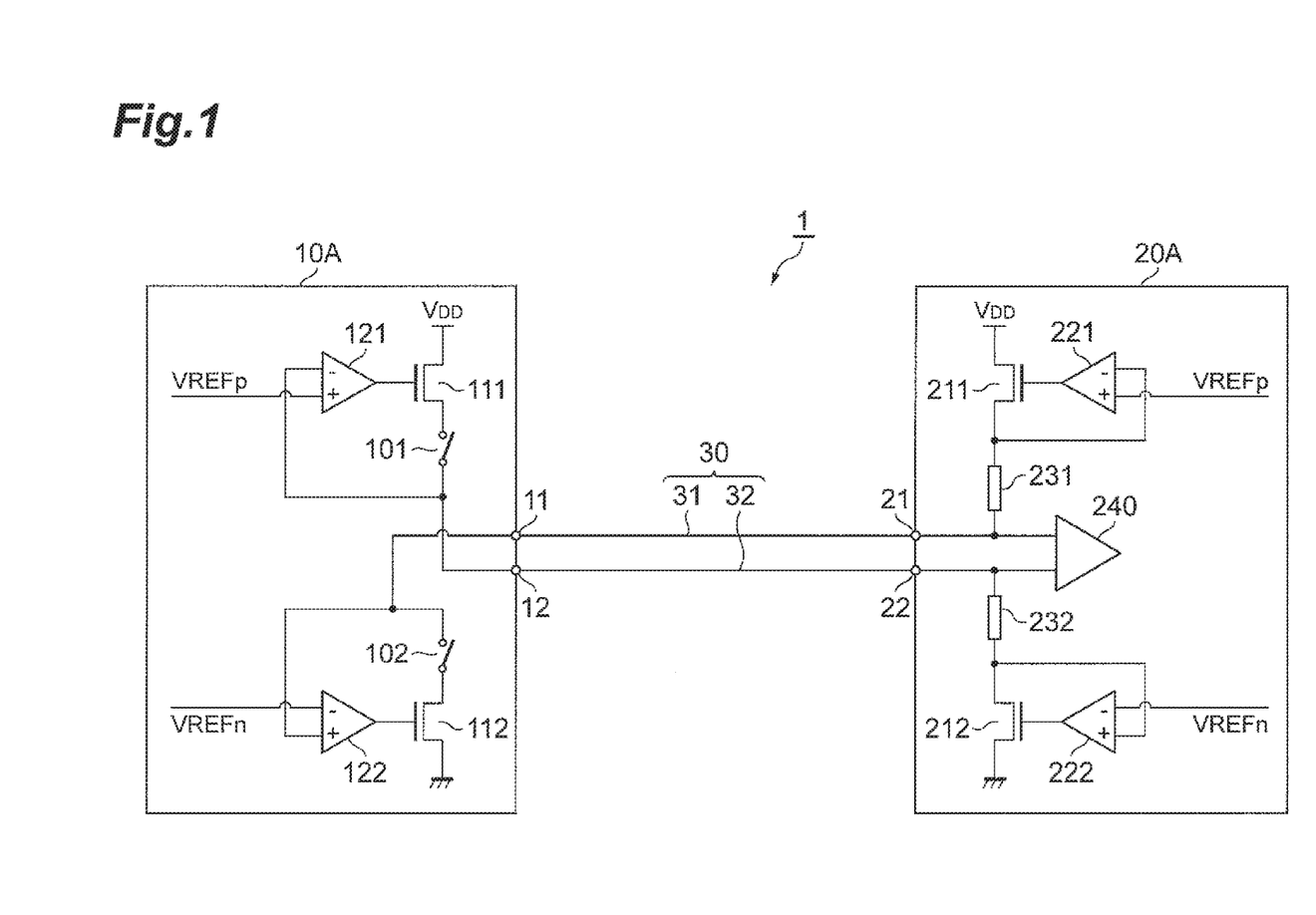
FIG. 1 is a view showing a configuration of a transmission/reception system 1 of a first embodiment.

FIG. 1 is a view showing a configuration of a transmission/reception system 1 of a first embodiment. The transmission/reception system 1 of the first embodiment includes a transmission apparatus 10A, and a reception apparatus 20A. The transmission/reception system 1 transmits differential signals from the transmission apparatus 10A to the reception apparatus 20A through differential signal line pair 30. A first transmission end 11 of the transmission apparatus 10A and a first reception end 21 of the reception apparatus 20A are coupled by a first signal line 31 which is one of the differential signal line pair 30. A second transmission end 12 of the transmission apparatus 10A and a second reception end 22 of the reception apparatus 20A are coupled by a second signal line 32 which is the other of the differential signal line pair 30.

The transmission apparatus 10A transmits differential signals, corresponding to an input signal, from the first transmission end 11 and the second transmission end 12. The transmission apparatus 10A includes a first switch 101, a second switch 102, a first transistor 111, a second transistor 112, a first differential amplifier 121, and a second differential amplifier 122. The first switch 101 and the second switch 102 may include an NMOS transistor. Furthermore, the first transistor 111 and the second transistor 112 may also include the NMOS transistor.

The first transistor 111 includes a first terminal (drain terminal), a second terminal (source terminal), and a control terminal (gate terminal). A first power source potential VDD is applied to the first terminal of the first transistor 1111. A resistance value between the first terminal and the second terminal of the first transistor 111 is set corresponding to a voltage value which is to be input to the control terminal of the first transistor 111. The first switch 101 is provided between the second terminal of the first transistor 111 and the second transmission end 12 and is set to be in either an open or close state corresponding to a level of the input signal.

The first differential amplifier 121 includes a first input terminal (inverting input terminal), a second input terminal (non-inverting input terminal), and an output terminal. The first input terminal of the first differential amplifier 121 is coupled to the second transmission end 12. A first reference potential VREFp is applied to the second input terminal of the first differential amplifier 121. The output terminal of the first differential amplifier 121 is coupled to the control terminal of the first transistor 111.

The second transistor 112 includes a first terminal (source terminal), a second terminal (drain terminal), and a control terminal (gate terminal). A second power source potential (ground potential) lower than the first power source potential VDD is applied to the first terminal of the second transistor 112. A resistance value between the first terminal and the second terminal of the second transistor 112 is set corresponding to a voltage value which is to be input to the control terminal of the second transistor 112. The second switch 102 is provided between the second terminal of the second transistor 112 and the first transmission end 11 and is set to be in either the open or close state corresponding to the level of the input signal.

The second differential amplifier 122 includes a first input terminal (non-inverting input terminal), a second input terminal (inverting input terminal), and an output terminal. The first input terminal of the second differential amplifier 122 is coupled to the first transmission end 11. A second reference potential VREFn lower than the first reference potential VREFp is applied to the second input terminal of the second differential amplifier 122. The output terminal of the second differential amplifier 122 is coupled to the control terminal of the second transistor 112.

Herein, the first input terminal of the first differential amplifier 121 may be coupled to the second terminal of the first transistor 111, while the first input terminal of the second differential amplifier 122 may be coupled to the second terminal of the second transistor 112. However, a magnitude of an electric current is influenced by the number of the transmission/reception apparatuses which are to be coupled. Considering such an influence, the first switch 101 and the second switch 102 are preferably provided as shown in the drawing.

The first transistor 111 may be provided separately from the first differential amplifier 121 or may include a driving unit which is to be provided in an output stage within the first differential amplifier 121. In a latter case, the first transistor 11.i and the first differential amplifier 121 can be regarded as being included in the differential amplifier. Similarly, the second transistor 112 may be provided separately from the second differential amplifier 122 or may include a driving unit which is to be provided in an output stage within the second differential amplifier 122. In a latter case, the second transistor 112 and the second differential amplifier 122 can be regarded as being included in the differential amplifier.

The reception apparatus 20A receives the differential signals which are input to the first reception end 21 and the second reception end 22. The reception apparatus 20A includes a first transistor 211, a second transistor 212, a first differential amplifier 221, a second differential amplifier 2.22, a first resistor 231, a second resistor 232, and a reception unit 240. The first transistor 211 and second transistor 212 may include the NMOS transistor.

The first transistor 211 includes a first terminal (drain terminal), a second terminal (source terminal), and a control terminal (gate terminal). The first power source potential VDD is applied to the first terminal of the first transistor 211. A resistance value between the first terminal and the second terminal of the first transistor 211 is set corresponding to a voltage value which is to be input to the control terminal of the first transistor 211. The first resistor 231 is provided between the second terminal of the first transistor 211 and the first reception end 21. The first resistor 231 pulls the first signal line 31 up to an H level.

The first differential amplifier 221 includes a first input terminal (inverting input terminal), a second input terminal (non-inverting input terminal), and an output terminal. The first input terminal of the first differential amplifier 221 is coupled to the second terminal of the first transistor 211. A first reference potential VREFp is applied to the second input terminal of the first differential amplifier 221. The output terminal of the first differential amplifier 221 is coupled to the control terminal of the first transistor 211. The first reference potential VREFp is applied to the second terminal of the first transistor 211.

The second transistor 212 includes a first terminal (source terminal), a second terminal (drain terminal), and a control terminal (gate terminal). The second power source potential (ground potential) lower than the first power source potential VDD is applied to the first terminal of the second transistor 212. A resistance value between the first terminal and the second terminal of the second transistor 212 is set corresponding to a voltage value which is to be input to the control terminal of the second transistor 212. The second resistor 232 is provided between the second terminal of the second transistor 212 and the second reception end 22. The second resistor 232 pulls the second signal line 32 down to an L level.

The second differential amplifier 222 includes a first input terminal (non-inverting input terminal), a second input terminal (inverting input terminal), and an output terminal. The first input terminal of the second differential amplifier 222 is coupled to the second terminal of the second transistor 212. A second reference potential VREFn lower than the first reference potential VREFp is applied to the second input terminal of the second differential amplifier 222. The output terminal of the second differential amplifier 222 is coupled to the control terminal of the second transistor 212. The second reference potential VREFn is applied to the second terminal of the second transistor 212.

The reception unit 240 receives the differential signals Which have been transmitted from the transmission apparatus 10 and arrived through the differential signal line pair 30 by inputting each voltage value of the first reception end 21 and the second reception end 22.

Herein, the first reference potential VREFp may be applied to one end of the first resistor 231 without providing either the first transistor 211 or the first differential amplifier 221. Furthermore, the second reference potential VREFn may be applied to one end of the second resistor 232 without providing either the second transistor 212 or the second differential amplifier 222.

Each first reference potential VREFp of the transmission apparatus 10A and the reception apparatus 20A may be similar or different. Furthermore, each second reference potential VREFn of the transmission apparatus 10A and the reception apparatus 20A may be similar or different.

Figure 2:
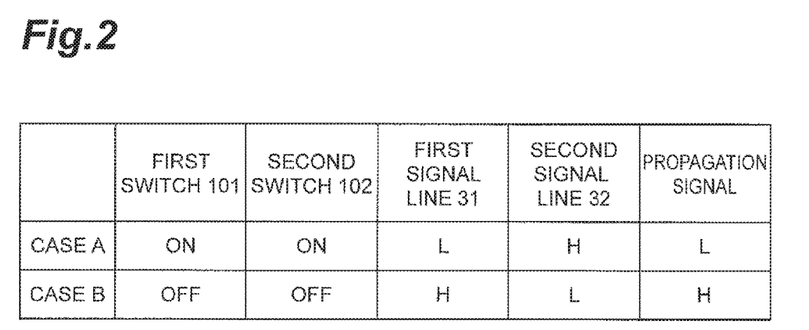
FIG. 2 is a table summarizing operations of the transmission/reception system 1 of the first embodiment.

FIG. 2 is a table summarizing operations of the transmission/reception system 1 of the first embodiment. The table herein shows two cases, A and B.

In the case A, the first switch 101 and the second switch 102 of the transmission apparatus 10A are both set to be in the close state (ON state). In this ease, the electric current flows from the first power source potential VDD of the reception apparatus 20A to the second reference potential (ground potential) of the transmission apparatus 10A through the first transistor 211 and the first resistor 231 of the reception apparatus 20A, the first signal line 31, and through the second switch 102 and the second transistor 112 of the transmission apparatus 10A. Furthermore, the electric current flows from the first power source potential VDD of the transmission apparatus 10A to the second reference potential (ground potential) of the reception apparatus 20A through the first transistor 111 and the first switch 101 of the transmission apparatus 10A, the second signal line 32, and through the second resistor 232 and the second transistor 212 of the reception apparatus 20A. As a result of the electric current flowing in this manner, the level of the first signal line 31 becomes L level, while the level of the second signal line 32 becomes H level. Therefore, L-level differential signals can be transmitted from the transmission apparatus 10A to the reception apparatus 20A.

In the case B, the first switch 101 and the second switch 102 of the transmission apparatus 10A are both set to be in the open state (OFF state). In this case, the electric current does not flow as in the case A. As a result, in the case B, the first signal line 31 is pulled up to the H level, while the second signal line 32 is pulled down to the L level. Therefore, H-level differential signals can be transmitted from the transmission apparatus 10A to the reception apparatus 20A.

Figure 3:
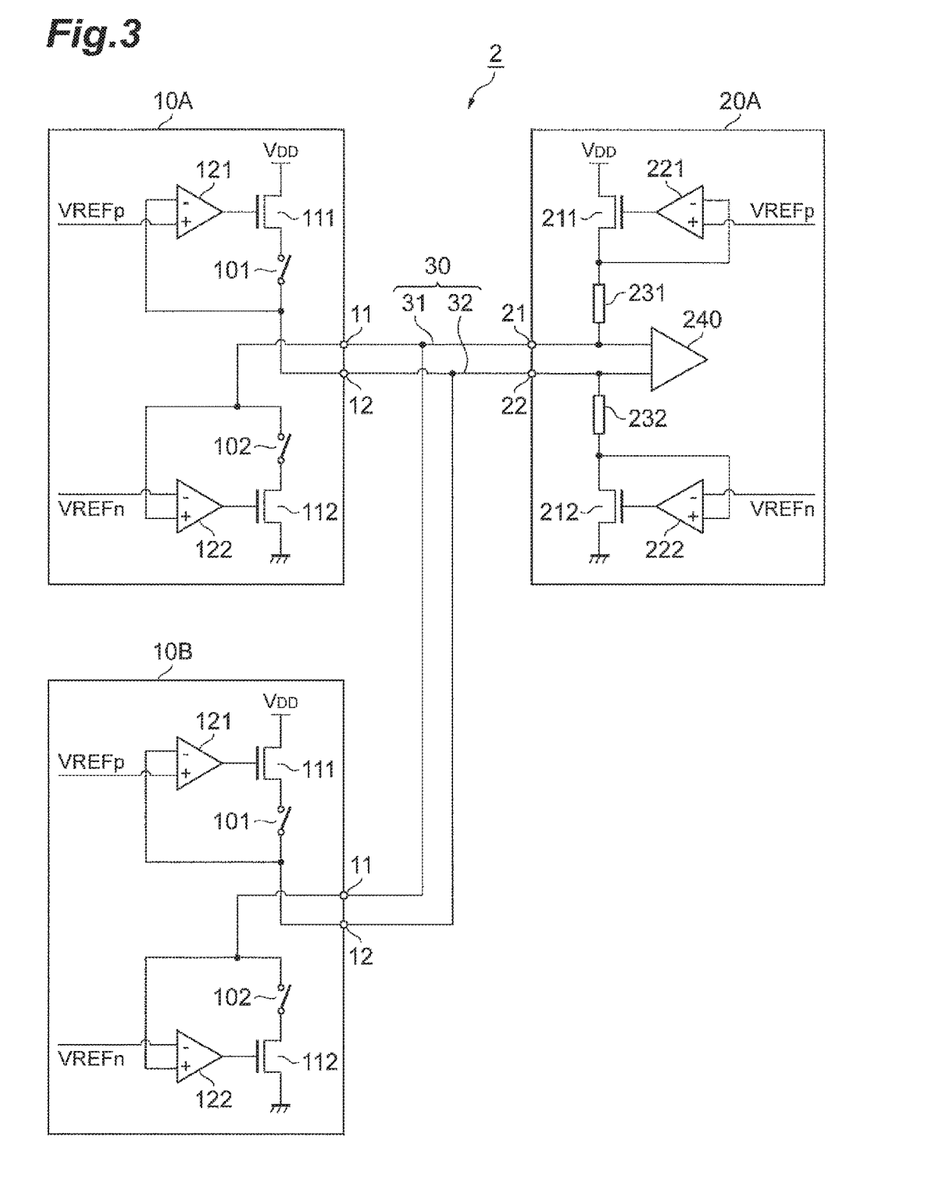
FIG. 3 is a view showing a configuration of a transmission/reception system 2 of a second embodiment.

FIG. 3 is a view showing a configuration of a transmission/reception system 2 of a second embodiment. The transmission/reception system 2 of the second embodiment includes transmission apparatuses 10A, 10B and a reception apparatus 20A. The transmission/reception system 2 transmits differential signals from the transmission apparatus 10A or the transmission apparatus 10B to the reception apparatus 20A through differential signal line pair 30. Each first transmission end 11 of the transmission apparatuses 10A and 1013 is coupled to a first reception end 21 of the reception apparatus 20A by a first signal line 31 which is one of the differential signal line pair 30. Each second transmission end 12 of transmission apparatuses 10A and 10B is coupled to a second reception end 22 of the reception apparatus 20A by a second signal line 32 which is the other of the differential signal line pair 30. Each of the transmission apparatuses 10A and 10B in the second embodiment includes a configuration similar to that of the transmission apparatus 10A in the first embodiment. The reception apparatus 20A in the second embodiment includes a configuration similar to that of the reception apparatus 20A in the first embodiment.

Figure 4:
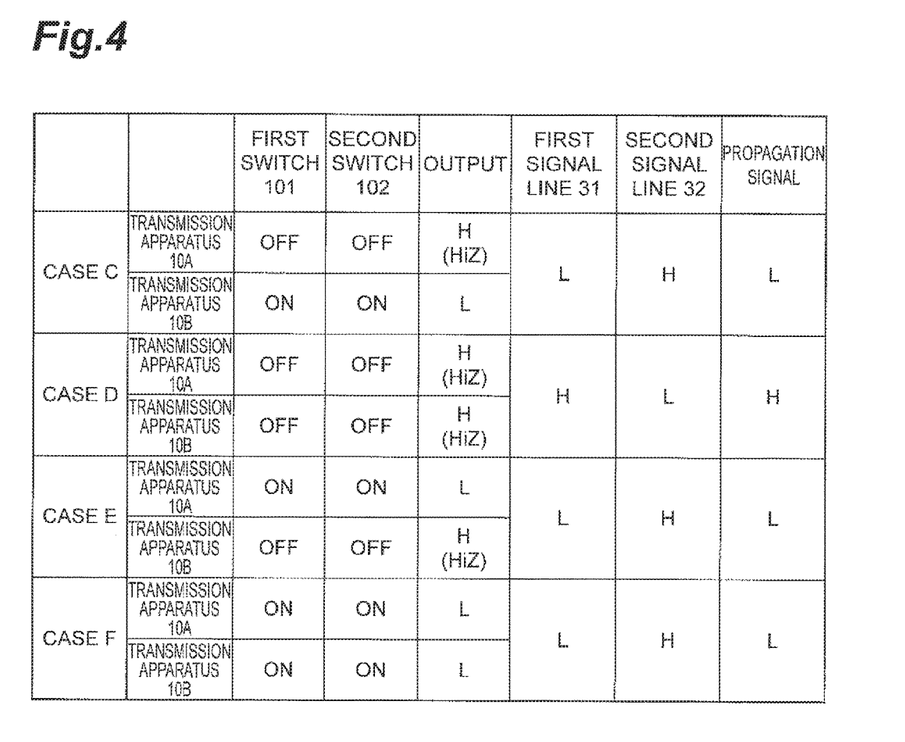
FIG. 4 is a table summarizing operations of the transmission/reception system 2 of the second embodiment.

FIG. 4 is a table summarizing operations of the transmission/reception system 2 in the second embodiment. In the table herein, four cases C to F are shown.

In the case C, the first switch 101 and the second switch 102 of one transmission apparatus 10A are both set to be in an open state (OFF state), while the first switch 101 and the second switch 102 of the other transmission apparatus 10B are both set to be in a close state (ON state). In this case, the transmission ends 11 and 12 of the transmission apparatus 10A are set to be in a high-impedance state, and a relation between the transmission apparatus 110B and the reception apparatus 20A becomes similar to the case A shown in FIG. 2. Accordingly, the first signal line 31 is pulled down to an L level, and the second signal line 32 is pulled down up an H level. Therefore, L-level differential signals can be transmitted from the transmission apparatus 10B to the reception apparatus 20A.

In the case D, the first switch 101 and the second switch 102 of one transmission apparatus 10A are both set to be in the open state (OFF state), and the first switch 101 and the second switch 102 of the other transmission apparatus 10B are both set to be in the open state (OFF state). In this case, the transmission ends 11 and 12 of the transmission apparatus 10A are set in the high-impedance state and the transmission ends 11 and 12 of the transmission apparatus 10B are also set in the high-impedance state, as similar to the case B shown in FIG. 2. Accordingly, the first signal line 31 is pulled up to the H level, and the second signal line 32 is pulled down to the L level. Therefore, H-level differential signals can be transmitted from the transmission apparatus 10A to the reception apparatus 20A.

In the case E, the first switch 101 and the second switch 102 of one transmission apparatus 10A are both set to be in the close state (ON state), while the first switch 101 and the second switch 102 of the other transmission apparatus 10B are both set to be in the open state (OFF state) In this case, the transmission ends 11 and 12 of the transmission apparatus 10B are set to be in the high-impedance state, and the relation between the transmission apparatus 10A and the reception apparatus 20A becomes similar to the case A shown in FIG. 2. Accordingly, the first signal line 31 is pulled down to an L level, and the second signal line 32 is pulled down up an H level. Therefore, L-level differential signals can be transmitted from the transmission apparatus 10B to the reception apparatus 20A.

In the case F, the first switch 101 and the second switch 102 of one transmission apparatus 10A are both set to be in the close state (ON state), and the first switch 101 and the second switch 102 of the other transmission apparatus 10B are both set to be in the close state (ON state) In this case, the relation between the transmission apparatus 10B and the reception apparatus 20A as well as the relation between the transmission apparatus 10A and the reception apparatus 20A become similar to the case A shown in FIG. 2. Accordingly, the first signal line 31 is pulled down to the L level, and the second signal line 32 is pulled up the H level. Therefore, L-level differential signals can be transmitted from the transmission apparatuses 10A and 10B to the reception apparatus 20A.

In the cases C and E, two transmission apparatuses 10A and 10B transmit different logical signals. In such a case, the occurrence of the receive error is restrained. Furthermore, in this case, the electric current flows through resistors 231, 232 and the value of electric current is controlled. Therefore, the occurrence of the fault of the transmission apparatuses 10A, 10B and reception apparatus 20A is restrained.

It should be noted that in a transmission/reception system where a plurality of transmission apparatuses and a reception apparatus are coupled by LVDS method, the following problems may arise. That is, when the plurality of transmission apparatuses transmits different logical signals, a first power source potential VDD of one transmission apparatus and a second power source potential (ground potential) of another transmission apparatus are directly coupled through a signal line, which may cause not only a large electric current to flow but also a potential in the signal line to be unstable. The transmission/reception system herein can solve these problems held by the transmission/reception system in the LVDS method.

Figure 5:
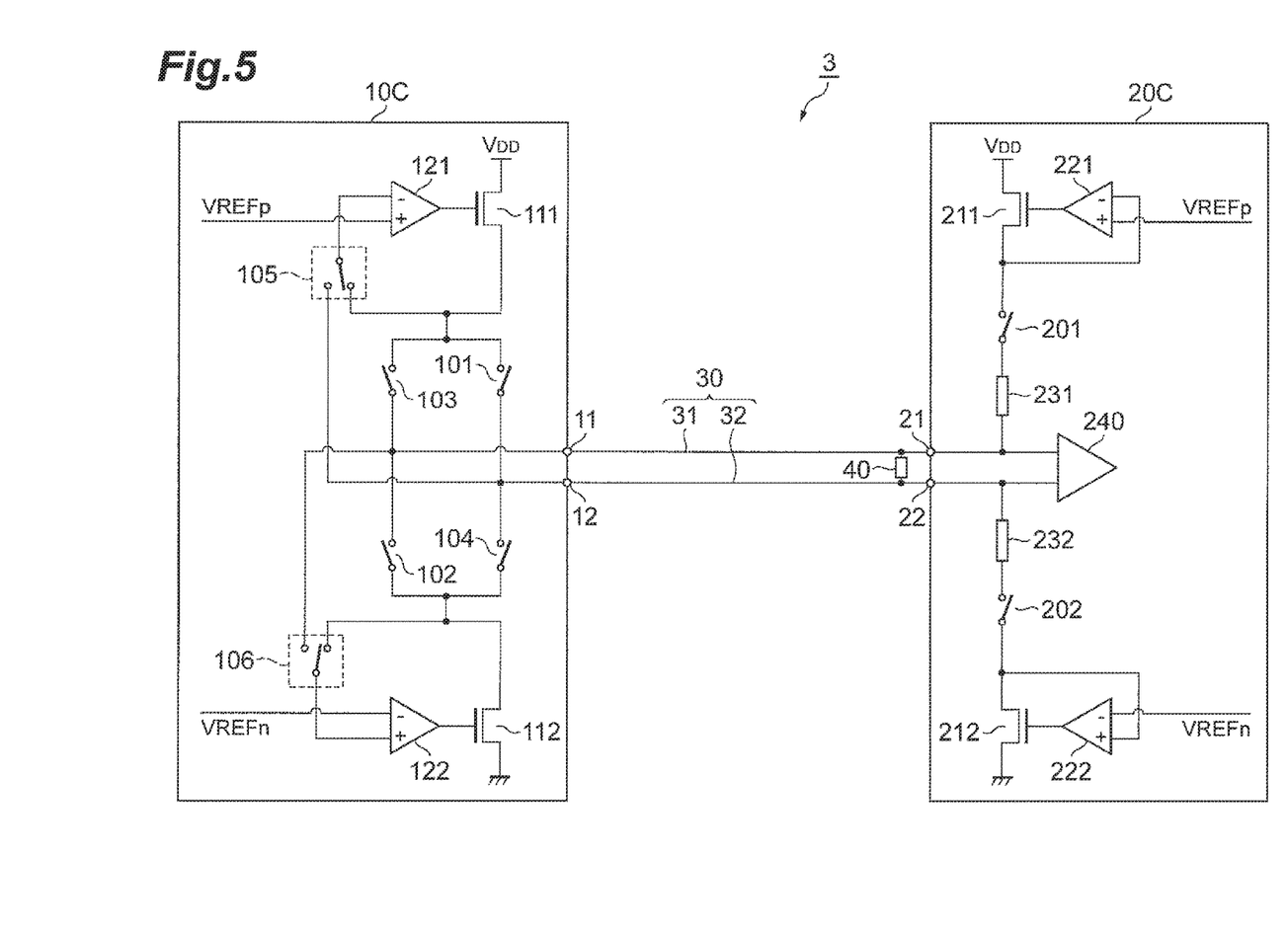
FIG. 5 is a view showing a configuration of a transmission/reception system 3 of a third embodiment.

FIG. 5 is a view showing a configuration of a transmission/reception system 3 of a third embodiment. The transmission/reception system 3 of the third embodiment includes a transmission apparatus 10C and a reception apparatus 20C. The transmission/reception system 3 transmits differential signals from the transmission apparatus 10C to the reception apparatus 20C through differential signal line pair 30. A first transmission end 11 of the transmission apparatus 10C and a first reception end 21 of the reception apparatus 20C are coupled by a first signal line 31 which is one of the differential signal line pair 30. A second transmission end 12 of the transmission apparatus 10C and a second reception end 22 of the reception apparatus 20C are coupled by a second signal line 32 which is the other of the differential signal line pair 30.

The transmission apparatus 10C transmits differential signals, corresponding to an input signal, from the first transmission end 11 and the second transmission end 12. The transmission apparatus 10C includes a first switch 101, a second switch 102, a third switch 103, a fourth switch 104, a fifth switch 105, a sixth switch 106, a first transistor 111, a second transistor 112, a first differential amplifier 121, and a second differential amplifier 122. The switches 101 to 104 may include an NMOS transistor. The fifth switch 105 and sixth switch 106 may include two NMOS transistors. Furthermore, the first transistor 111 and the second transistor 112 may also include the NMOS transistor.

In addition to the configuration of the transmission apparatus 10A in the first embodiment, the transmission apparatus 10C in the third embodiment further includes the third switch 103, the fourth switch 104, the fifth switch 105, and the sixth switch 106. The third switch 103 is provided between a second terminal of the first transistor 111 and the first transmission end 11 and is set to be in either an open or close state corresponding to a level of the input signal. The fourth switch 104 is provided between a second terminal of the second transistor 112 and the second transmission end 12 and is set to be in either the open or close state corresponding to the level of the input signal. The fifth switch 105 selectively connects a first input terminal of the first differential amplifier 121 to the second terminal of the first transistor 111 or the second transmission end 12. The sixth switch 106 selectively connects first input terminal of the second differential amplifier 122 to the second terminal of the second transistor 112 or the first transmission end 11.

The reception apparatus 20C receives the differential signals which are input to the first reception end 21 and the second reception end 22. The reception apparatus 20C includes a first switch 201, a second switch 202, a first transistor 211, a second transistor 212, a first differential amplifier 221, a second differential amplifier 222, a first resistor 231, a second resistor 232, and a reception unit 240. The first switch 201 and second switch 202 may include the NMOS transistor. Furthermore, the first transistor 211 and second transistor 212 may also include the NMOS transistor.

In addition to the configuration of the reception apparatus 20A in the first embodiment, the reception apparatus 20C in the third embodiment further includes the first switch 201 and the second switch 202. The first switch 201 is provided between the first resistor 231 and the second terminal of the first transistor 211 to which a first reference potential VREFp is applied. The second switch 202 is provided between the second resistor 232 and the second terminal of the second transistor 212 to which a second reference potential VREFn is applied. Herein, the first switch 201 may be provided between the first resistor 231 and the first reception end 21, while the second switch 202 may be provided between the second resistor 232 and the second reception end 22.

Two operation aspects are possible in the transmission/reception system 3 of the third embodiment. With regard to a first operation aspect of the transmission/reception system 3, in the transmission apparatus 10C, the third switch 103 and the fourth switch 104 are set to be in the open state (OFF state). Herein, the first input terminal of the first differential amplifier 121 is coupled to the second transmission end 12 by the fifth switch 105, while the first input terminal of the second differential amplifier 122 is coupled to the first transmission end 11 by the sixth switch 106. Furthermore, in the reception apparatus 20C, the first switch 201 and the second switch 202 are set to be in the close state (ON state).

It should be noted that in the first operation aspect, a resistor 40 shown in the drawing is not provided.

With regard to the first operation aspect, by setting each state of the switches 103 to 106, 201 and 202 in this manner, the transmission/reception system 3 includes a configuration equivalent to the configuration of the transmission/reception system 1 of the first embodiment shown in FIG. 1. Furthermore, the transmission/reception system 3 can perform an operation similar to the operation of the transmission/reception system 1 of the first embodiment described with reference to FIG. 2. In this case, the transmission apparatus 10A may take the place of the transmission apparatus 10C, and the reception apparatus 20A may take the place of the reception apparatus 20C.

With regard to a second operation aspect of the transmission/reception system 3, in the transmission apparatus 10C, the first input terminal of the first differential amplifier 121 is coupled to the second terminal of the first transistor 111 by the fifth switch 105, while the first input terminal of the second differential amplifier 122 is coupled to the second terminal of the second transistor 112 by the sixth switch 106. In the reception apparatus 20C, the first switch 201 and the second switch 202 are set to be in the open state (OFF state). Furthermore, the resistor 40 is provided between the reception end 21 and the reception end 22.

In the second operation aspect, by providing the resistor 40 as well as setting each state of the switches 105, 106, 201, and 202 in this manner, the transmission/reception system 3 can perform an operation in the LVDS method. In other words, in the transmission apparatus 10C, by setting the switches 101 and 102 in the close state (ON state) and by setting the switches 103 and 104 in the open state (OFF state), the first signal line 31 is pulled down to an L level and the second signal line 32 is pulled up to an H level. Therefore, it is possible to transmit L-level differential signals from the transmission apparatus 10C to reception apparatus 20C. Furthermore, in the transmission apparatus 10C, by setting the switches 101 and 102 in the open state (OFF state) and the switches 103 and 104 in the close state (ON state), the first signal line 31 is pulled up to the H level, and the second signal line 32 is pulled down to the L level. Therefore, it is possible to transmit H-level differential signals from the transmission apparatus 10C to the reception apparatus 20C.

In the transmission/reception system herein, even when a plurality of transmission apparatuses transmits different logical signals, it is possible to prevent an excessive electric current from flowing, and the reception end of the reception apparatus will not be in logically unstable state. Accordingly, in the transmission/reception system herein, it is possible to transmit the differential signals by the multi-drop or multi-point method with a simple configuration without relaying with hub mechanism and without involving a capacitor or an inductor.

INDUSTRIAL APPLICABILITY

The present invention is applicable to a usage of a transmission apparatus, a reception apparatus, and a transmission/reception system where an occurrence of a receive error or a fault can be reduced with a simple configuration without involving a capacitor or an inductor even in a case of transmitting differential signals by a multi-drop or multi-point method.

REFERENCE SIGNS LIST 1 to 3 TRANSMISSION/RECEPTION SYSTEM
10A, 10B, 10C TRANSMISSION APPARATUS
11 FIRST TRANSMISSION END
12 SECOND TRANSMISSION END
101 FIRST SWITCH
102 SECOND SWITCH
103 THIRD SWITCH
104 FOURTH SWITCH
105 FIFTH SWITCH
106 SIXTH SWITCH
111 FIRST TRANSISTOR
112 SECOND TRANSISTOR
121 FIRST DIFFERENTIAL AMPLIFIER
122 SECOND DIFFERENTIAL AMPLIFIER
20A, 20C RECEPTION APPARATUS
21 FIRST RECEPTION END
22 SECOND RECEPTION END
201 FIRST SWITCH
202 SECOND SWITCH
211 FIRST TRANSISTOR
212 SECOND TRANSISTOR
221 FIRST DIFFERENTIAL AMPLIFIER
222 SECOND DIFFERENTIAL AMPLIFIER
231 FIRST RESISTOR
232 SECOND RESISTOR
240 RECEPTION UNIT
30 DIFFERENTIAL SIGNAL LINE PAIR
31 FIRST SIGNAL LINE
32 SECOND SIGNAL LINE
40 RESISTOR

The invention claimed is:

1. A transmission apparatus transmitting differential signals, corresponding to an input signal, from a first transmission end and a second transmission end, the transmission apparatus, comprising:
a first transistor including a first terminal, a second terminal, and a control terminal, wherein a first power source potential is applied to the first terminal, and a resistance value between the first terminal and the second terminal is set corresponding to a voltage value which is to be input to the control terminal;
a first switch provided between the second terminal of the first transistor and the second transmission end and set to be in either an open or close state corresponding to a level of the input signal;
a first differential amplifier including a first input terminal, a second input terminal, and an output terminal, wherein the first input terminal is connected to the second terminal of the first transistor or the second transmission end, a first reference potential is applied to the second input terminal, and the output terminal is connected to the control terminal of the first transistor;
a second transistor including a first terminal, a second terminal, and a control terminal, wherein a second power source potential lower than the first power source potential is applied to the first terminal, and a resistance value between the first terminal and the second terminal is set corresponding to a voltage value which is to be input to the control terminal;
a second switch provided between the second terminal of the second transistor and the first transmission end and set to be in either the open or close state corresponding to the level of the input signal; and
a second differential amplifier including a first input terminal, a second input terminal, and an output terminal, wherein the first input terminal being connected to the second terminal of the second transistor or the first transmission end, a second reference potential lower than the first reference potential is applied to the second input terminal, and the output terminal is connected to the control terminal of the second transistor,
wherein when the first switch and the second switch are both set to be in an open state, the first transmission end and the second transmission end are set to be in a high-impedance state.

2. The transmission apparatus according to claim 1, further comprising:
a third switch provided between the second terminal of the first transistor and the first transmission end and set to be in either the open or close state corresponding to the level of the input signal;
a fourth switch provided between the second terminal of the second transistor and the second transmission end and set to be in either the open or close state corresponding to the level of the input signal;
a fifth switch selectively connecting the first input terminal of the first differential amplifier to either the second terminal of the first transistor or the second transmission end; and
a sixth switch selectively connecting the first input terminal of the second differential amplifier to either the second terminal of the second transistor or the first transmission end.

3. A transmission/reception system, comprising:
the transmission apparatus according to claim 1;
a reception apparatus receiving differential signals which are input to a first reception end and a second reception end, the reception apparatus comprising:
a first resistor provided between the first reception end and a first reference potential end to which a first reference potential is applied;
a second resistor provided between the second reception end and a second reference potential end to which a second reference potential lower than the first reference potential is applied; and
a reception unit receiving the differential signals by inputting each voltage value of the first reception end and the second reception end;
a first signal line connecting the first transmission end of the transmission apparatus and the first reception end of the reception apparatus; and
a second signal line connecting the second transmission end of the transmission apparatus and the second reception end of the reception apparatus.

4. A transmission/reception system, comprising:
a plurality of transmission apparatuses according to claim 1;
a reception apparatus receiving differential signals which are input to a first reception end and a second reception end, the reception apparatus comprising:
a first resistor provided between the first reception end and a first reference potential end to which a first reference potential is applied;
a second resistor provided between the second reception end and a second reference potential end to which a second reference potential lower than the first reference potential is applied; and
a reception unit receiving the differential signals by inputting each voltage value of the first reception end and the second reception end;

a first signal line connecting the first transmission end of each of the plurality of transmission apparatuses and the first reception end of the reception apparatus; and
a second signal line connecting the second transmission end of each of the plurality of transmission apparatuses and the second reception end of the reception apparatus.

5. The transmission/reception system according to claim 3, wherein said reception apparatus, further comprises:
a first transistor including a first terminal, a second terminal, and a control terminal, wherein a first power source potential is applied to the first terminal, the second terminal is connected to the first reference potential end, and a resistance value between the first terminal and the second terminal is set corresponding to a voltage value which is to be input to the control terminal;
a first differential amplifier including a first input terminal, a second input terminal, and an output terminal, wherein the first input terminal is connected to the second terminal of the first transistor, the first reference potential is applied to the second input terminal, and the output terminal is connected to the control terminal of the first transistor;
a second transistor including a first terminal, a second terminal, and a control terminal, wherein a second power source potential lower than the first power source potential is applied to the first terminal, the second terminal is connected to the second reference potential end, and the resistance value between the first terminal and the second terminal is set corresponding to the voltage value which is to be input to the control terminal; and
a second differential amplifier including a first input terminal, a second input terminal, and an output terminal, wherein the first input terminal is connected to the second terminal of the second transistor, the second reference potential is applied to the second input terminal, and the output terminal is connected to the control terminal of the second transistor.

6. The transmission/reception system according to claim 3, wherein said reception apparatus, further comprises:
a first switch provided between the first reference potential end and the first resistor or between the first resistor and the first reception end; and
a second switch provided between the second reference potential end and the second resistor or between the second resistor and the second reception end.

7. A transmission/reception system, comprising:
the transmission apparatus according to claim 2;
a reception apparatus receiving differential signals which are input to a first reception end and a second reception end, the reception apparatus comprising:
a first resistor provided between the first reception end and a first reference potential end to which a first reference potential is applied;
a second resistor provided between the second reception end and a second reference potential end to which a second reference potential lower than the first reference potential is applied; and
a reception unit receiving the differential signals by inputting each voltage value of the first reception end and the second reception end;
a first signal line connecting the first transmission end of the transmission apparatus and the first reception end of the reception apparatus; and
a second signal line connecting the second transmission end of the transmission apparatus and the second reception end of the reception apparatus.

8. The transmission/reception system according to claim 7, comprising:
wherein said reception apparatus further comprises:
a first transistor including a first terminal, a second terminal, and a control terminal, wherein a first power source potential is applied to the first terminal, the second terminal is connected to the first reference potential end, and a resistance value between the first terminal and the second terminal is set corresponding to a voltage value which is to be input to the control terminal;
a first differential amplifier including a first input terminal, a second input terminal, and an output terminal, wherein the first input terminal is connected to the second terminal of the first transistor, the first reference potential is applied to the second input terminal, and the output terminal is connected to the control terminal of the first transistor;
a second transistor including a first terminal, a second terminal, and a control terminal, wherein a second power source potential lower than the first power source potential is applied to the first terminal, the second terminal is connected to the second reference potential end, and the resistance value between the first terminal and the second terminal is set corresponding to the voltage value which is to be input to the control terminal; and
a second differential amplifier including a first input terminal, a second input terminal, and an output terminal, wherein the first input terminal is connected to the second terminal of the second transistor, the second reference potential is applied to the second input terminal, and the output terminal is connected to the control terminal of the second transistor.

9. The transmission/reception system according to claim 7, wherein said reception apparatus further comprises:
a first switch provided between the first reference potential end and the first resistor or between the first resistor and the first reception end; and
a second switch provided between the second reference potential end and the second resistor or between the second resistor and the second reception end.

10. The transmission/reception system according to claim 4, wherein said reception apparatus, further comprises:
a first transistor including a first terminal, a second terminal, and a control terminal, wherein a first power source potential is applied to the first terminal, the second terminal is connected to the first reference potential end, and a resistance value between the first terminal and the second terminal is set corresponding to a voltage value which is to be input to the control terminal;
a first differential amplifier including a first input terminal, a second input terminal, and an output terminal, wherein the first input terminal is connected to the second terminal of the first transistor, the first reference potential is applied to the second input terminal, and the output terminal is connected to the control terminal of the first transistor;
a second transistor including a first terminal, a second terminal, and a control terminal, wherein a second power source potential lower than the first power source potential is applied to the first terminal, the second terminal is connected to the second reference potential end, and the resistance value between the first terminal and the second terminal is set corresponding to the voltage value which is to be input to the control terminal; and a second differential amplifier including a first input terminal, a second input terminal, and an output terminal, wherein the first input terminal is connected to the second terminal of the second transistor, the second reference potential is applied to the second input terminal, and the output terminal is connected to the control terminal of the second transistor.

11. The transmission/reception system according to claim 4, wherein said reception apparatus, further comprises:

a first switch provided between the first reference potential end and the first resistor or between the first resistor and the first reception end; and a second switch provided between the second reference potential end and the second resistor or between the second resistor and the second reception end.

12. A transmission/reception system, comprising:

the transmission apparatus according to claim 2;

a reception apparatus receiving differential signals which are input to a first reception end and a second reception end, the reception apparatus comprising:

a first resistor provided between the first reception end and a first reference potential end to which a first reference potential is applied;

a second resistor provided between the second reception end and a second reference potential end to which a second reference potential lower than the first reference potential is applied; and a reception unit receiving the differential signals by inputting each voltage value of the first reception end and the second reception end;

a first signal line connecting the first transmission end of each of the plurality of transmission apparatuses and the first reception end of the reception apparatus; and a second signal line connecting the second transmission end of each of the plurality of transmission apparatuses and the second reception end of the reception apparatus.

13. The transmission/reception system according to claim 12, wherein said reception apparatus, further comprises:

a first transistor including a first terminal, a second terminal, and a control terminal, wherein a first power source potential is applied to the first terminal, the second terminal is connected to the first reference potential end, and a resistance value between the first terminal and the second terminal is set corresponding to a voltage value which is to be input to the control terminal;

a first differential amplifier including a first input terminal, a second input terminal, and an output terminal, wherein the first input terminal is connected to the second terminal of the first transistor, the first reference potential is applied to the second input terminal, and the output terminal is connected to the control terminal of the first transistor;

a second transistor including a first terminal, a second terminal, and a control terminal, wherein a second power source potential lower than the first power source potential is applied to the first terminal, the second terminal is connected to the second reference potential end, and the resistance value between the first terminal and the second terminal is set corresponding to the voltage value which is to be input to the control terminal; and a second differential amplifier including a first input terminal, a second input terminal, and an output terminal, wherein the first input terminal is connected to the second terminal of the second transistor, the second reference potential is applied to the second input terminal, and the output terminal is connected to the control terminal of the second transistor.

14. The transmission/reception system according to claim 12, wherein said reception apparatus, further comprises:

a first switch provided between the first reference potential end and the first resistor or between the first resistor and the first reception end; and a second switch provided between the second reference potential end and the second resistor or between the second resistor and the second reception end.

15. A reception apparatus receiving differential signals which are input to a first reception end and a second reception end, the reception apparatus comprising:

a first resistor provided between the first reception end and a first reference potential end to which a first reference potential is applied;

a second resistor provided between the second reception end and a second reference potential end to which a second reference potential lower than the first reference potential is applied;

a reception unit receiving the differential signals by inputting each voltage value of the first reception end and the second reception end;

a first transistor including a first terminal, a second terminal, and a control terminal, wherein a first power source potential is applied to the first terminal, the second terminal is connected to the first reference potential end, and a resistance value between the first terminal and the second terminal is set corresponding to a voltage value which is to be input to the control terminal;

a first differential amplifier including a first input terminal, a second input terminal, and an output terminal, wherein the first input terminal is connected to the second terminal of the first transistor, the first reference potential is applied to the second input terminal, and the output terminal is connected to the control terminal of the first transistor;

a second transistor including a first terminal, a second terminal, and a control terminal, wherein a second power source potential lower than the first power source potential is applied to the first terminal, the second terminal is connected to the second reference potential end, and the resistance value between the first terminal and the second terminal is set corresponding to the voltage value which is to be input to the control terminal; and a second differential amplifier including a first input terminal, a second input terminal, and an output terminal, wherein the first input terminal is connected to the second terminal of the second transistor, the second reference potential is applied to the second input terminal, and the output terminal is connected to the control terminal of the second transistor.

16. The reception apparatus according to claim 15, further comprising:

a first switch provided between the first reference potential end and the first resistor or between the first resistor and the first reception end; and a second switch provided between the second reference potential end and the second resistor or between the second resistor and the second reception end.

\* \* \* \* \*